(12) United States Patent
Nakajima

(10) Patent No.: US 12,431,933 B2
(45) Date of Patent: Sep. 30, 2025

(54) RADIO-FREQUENCY MODULE AND COMMUNICATION DEVICE

(71) Applicant: Murata Manufacturing Co., Ltd., Kyoto (JP)

(72) Inventor: Reiji Nakajima, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 621 days.

(21) Appl. No.: 17/934,692

(22) Filed: Sep. 23, 2022

(65) Prior Publication Data

US 2023/0017570 A1 Jan. 19, 2023

Related U.S. Application Data

(63) Continuation of application No. PCT/JP2021/016490, filed on Apr. 23, 2021.

(30) Foreign Application Priority Data

Apr. 24, 2020 (JP) .................. 2020-077819

(51) Int. Cl.
*H04B 1/40* (2015.01)
*H03F 3/24* (2006.01)

(52) U.S. Cl.
CPC ........... *H04B 1/40* (2013.01); *H03F 3/245* (2013.01); *H03F 2200/165* (2013.01); *H03F 2200/171* (2013.01); *H03F 2200/294* (2013.01); *H03F 2200/451* (2013.01)

(58) Field of Classification Search
CPC .......... H04B 1/40; H04B 1/38; H04B 1/0483; H03F 3/245; H03F 2200/165; H03F 2200/171; H03F 2200/294; H03F 2200/451; H03F 1/565; H03F 3/195; H03F 1/0277;

(Continued)

(56) References Cited

U.S. PATENT DOCUMENTS 11,601,153 B2* 3/2023 Yoshimi .................... H03F 3/19
2013/0307616 A1* 11/2013 Berchtold ............... H03F 3/211
323/318

(Continued)

FOREIGN PATENT DOCUMENTS

JP 2012-142695 A 7/2012
JP 2017-157922 A 9/2017

(Continued)

OTHER PUBLICATIONS

International Search Report for PCT/JP2021/016490 dated Jul. 20, 2021.

*Primary Examiner* — Cindy Trandai
(74) *Attorney, Agent, or Firm* — McDonald Hopkins LLC

(57) ABSTRACT

Loss in a low-pass filter is reduced. A radio-frequency module includes an antenna terminal, a power amplifier, a low-noise amplifier, and a low-pass filter. The low-pass filter is disposed on a transmit path between the antenna terminal and the power amplifier and on a receive path between the antenna terminal and the low-noise amplifier. The low-pass filter has multiple paths. Each of the paths forms a part of either one or both of the transmit path and the receive path. The paths include a first path and a second path. The second path has a smaller reactance than the first path.

20 Claims, 3 Drawing Sheets

(58) Field of Classification Search
CPC ......... H03F 2200/411; H03F 2200/429; H03F 2200/537
See application file for complete search history.

(56) References Cited

U.S. PATENT DOCUMENTS

| | | | |
|---|---|---|---|
| 2014/0334362 A1* | 11/2014 | Granger-Jones | H03J 3/20 334/78 |
| 2015/0235971 A1 | 8/2015 | Smith et al. | |
| 2016/0242113 A1* | 8/2016 | McIntyre | H04W 52/0209 |
| 2017/0006341 A1 | 1/2017 | Lee et al. | |
| 2017/0250669 A1 | 8/2017 | Kuroyanagi et al. | |
| 2017/0264336 A1 | 9/2017 | Saji | |
| 2017/0288724 A1* | 10/2017 | Kamgaing | H04B 1/48 |
| 2017/0353287 A1 | 12/2017 | Onaka et al. | |
| 2018/0019768 A1* | 1/2018 | King | H04L 27/0002 |
| 2018/0131501 A1* | 5/2018 | Little | H04B 1/0064 |
| 2018/0175798 A1* | 6/2018 | Cabanillas | H03F 3/211 |
| 2019/0052291 A1* | 2/2019 | King | H04B 1/56 |
| 2019/0190563 A1* | 6/2019 | Sakurai | H04B 1/0057 |
| 2020/0235760 A1 | 7/2020 | Nakajima | |
| 2020/0252092 A1* | 8/2020 | Hisano | H04B 1/0057 |
| 2020/0412341 A1* | 12/2020 | Vadamalu | G01M 15/02 |
| 2021/0013883 A1* | 1/2021 | Sieg | B60R 16/0231 |

FOREIGN PATENT DOCUMENTS

| | | |
|---|---|---|
| JP | 2017-168932 A | 9/2017 |
| WO | 2016/129401 A1 | 8/2016 |
| WO | 2019/073832 A1 | 4/2019 |

* cited by examiner

RADIO-FREQUENCY MODULE AND COMMUNICATION DEVICE

CROSS REFERENCE TO RELATED APPLICATION

This is a continuation of International Application No. PCT/JP2021/016490 filed on Apr. 23, 2021 which claims priority from Japanese Patent Application No. 2020-077819 filed on Apr. 24, 2020. The contents of these applications are incorporated herein by reference in their entireties.

BACKGROUND ART

Technical Field

The present disclosure generally relates to a radio-frequency module and a communication device, and, more specifically, to a radio-frequency module which includes a power amplifier and a low-noise amplifier, and a communication device which includes the radio-frequency module.

In the related art, a known radio-frequency system (radio-frequency module) includes a filter and an antenna switch (for example, see Patent Document 1). The radio-frequency system described in Patent Document 1 includes a filter and an antenna switch. The antenna switch is a switch for switching the path for connection to an antenna. The radio-frequency system described in Patent Document 1 further includes a notch filter. The notch filter is disposed between the filter and the antenna.

Patent Document 1: U.S. Patent Application Publication No. 2017/006341

BRIEF SUMMARY

The radio-frequency module of the related art, which is described in Patent Document 1, has a problem in that, since all radio-frequency signals go through the same path, the loss in a low-pass filter is also large for radio-frequency signals for which attenuation of harmonic wave components is not necessary.

The present disclosure provides a radio-frequency module and a communication device which achieve a reduction of the loss in a low-pass filter.

A radio-frequency module according to an aspect of the present disclosure includes an antenna terminal, a power amplifier, a low-noise amplifier, and a low-pass filter. The low-pass filter is disposed on a transmit path and on a receive path. The transmit path is a path between the antenna terminal and the power amplifier. The receive path is a path between the antenna terminal and the low-noise amplifier. The low-pass filter has multiple paths. Each of the paths forms a part of at least one of the transmit path or the receive path. The paths include a first path and a second path. The second path has a smaller reactance than the first path.

A radio-frequency module according to an aspect of the present disclosure includes an antenna terminal, a power amplifier, a low-noise amplifier, and a low-pass filter. The low-pass filter is disposed on a transmit path and on a receive path. The transmit path is a path between the antenna terminal and the power amplifier. The receive path is a path between the antenna terminal and the low-noise amplifier. The low-pass filter has multiple paths. Each of the paths forms a part of at least one of the transmit path or the receive path. The low-pass filter includes an inductor and a capacitor. The paths include a first path and a second path. The first path goes through the capacitor. The second path bypasses the capacitor.

A communication device according to an aspect of the present disclosure includes the radio-frequency module and a signal processing circuit. The signal processing circuit processes a transmit signal which goes through the transmit path and a receive signal which goes through the receive path.

The radio-frequency module and the communication device according to the aspects of the present disclosure achieve a reduction of the loss in a low-pass filter.

DETAILED DESCRIPTION

Figure 1:
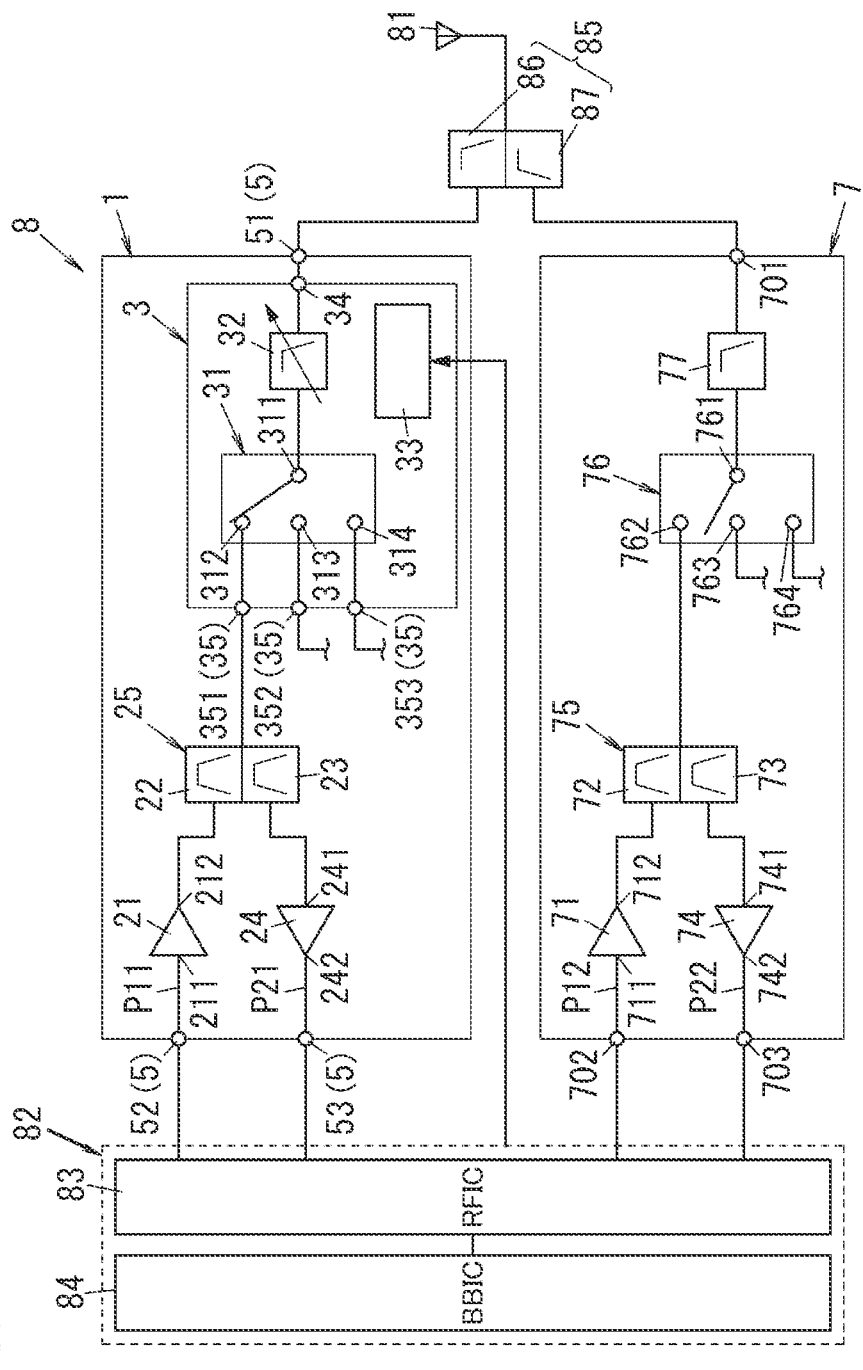
FIG. 1 is a diagram illustrating the circuit configuration of a communication device including a radio-frequency module according to an embodiment.

A radio-frequency module and a communication device according to an embodiment will be described below by referring to the drawings. The figures, which are referred to in the embodiment and the like described below, are schematic. The ratios in size and thickness of each component in the figures do not necessarily reflect the actual dimensional ratios.

Embodiment

(1) A Radio-Frequency Module

The configuration of a radio-frequency module 1 according to the embodiment will be described by referring to drawings.

As illustrated in FIG. 1, the radio-frequency module 1 according to the embodiment includes a first power amplifier 21, a first transmit filter 22, a first receive filter 23, and a first low-noise amplifier 24. The first transmit filter 22 and the first receive filter 23 form a duplexer 25. The radio-frequency module 1 further includes a switch module 3.

Figure 3:
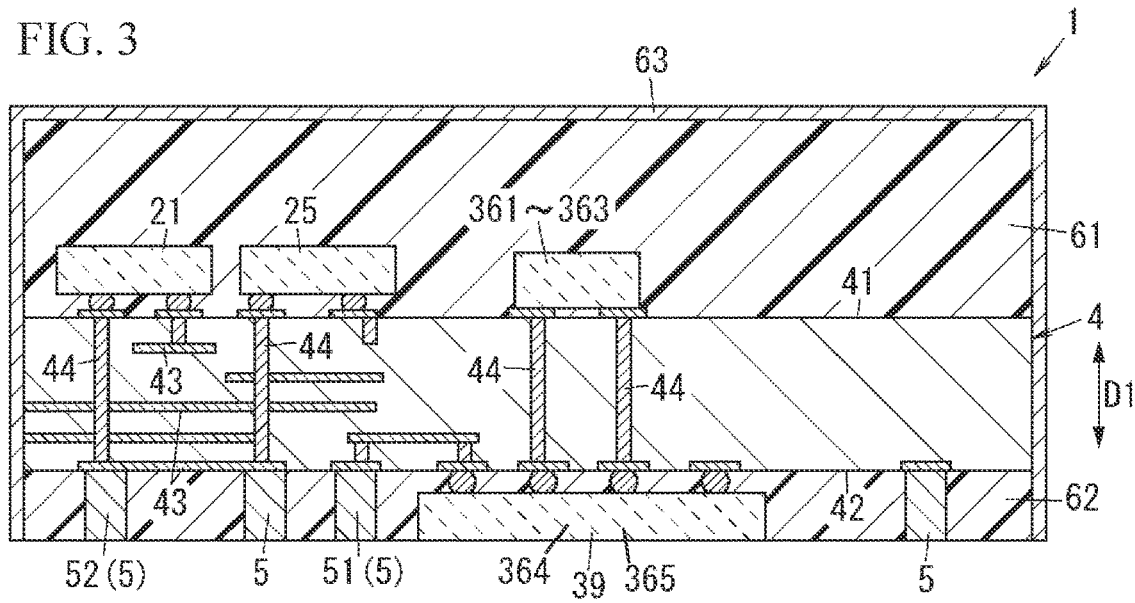
FIG. 3 is a cross-sectional view of the radio-frequency module.

As illustrated in FIG. 3, the radio-frequency module 1 includes a mounting substrate 4, multiple external connection terminals 5, a first resin member 61, a second resin member 62, and a shield layer 63.

As illustrated in FIG. 1, the radio-frequency module 1 is used, for example, in a communication device 8. The communication device 8 is, for example, a cellular phone such as a smartphone. The communication device 8 is not limited to a cellular phone, and may be, for example, a wearable terminal such as a smartwatch.

The communication device 8 performs communication in a first communication band and communication in a second communication band. More specifically, the communication device 8 transmits transmit signals in the first communication band (hereinafter referred to as "first transmit signals"), and receives receive signals in the first communication band (hereinafter referred to as "first receive signals"). Further, the communication device 8 transmits transmit signals in the second communication band (hereinafter referred to as "second transmit signals"), and receives receive signals in the second communication band (hereinafter referred to as "second receive signals").

The first transmit signals and the first receive signals are TDD (Time Division Duplex) signals. The first transmit signals and the first receive signals are not limited to TDD signals, and may be FDD (Frequency Division Duplex) signals. TDD is a wireless communication technique in which the same frequency band is allocated to transmission and reception in wireless communication, and in which transmission and reception are switched at each time period. FDD is a wireless communication technique in which different frequency bands are allocated to transmission and reception in wireless communication to perform transmission and reception.

The second transmit signals and the second receive signals are TDD signals. The second transmit signals and the second receive signals are not limited to TDD signals, and may be FDD signals.

(2) The Circuit Configuration of the Radio-Frequency Module

The circuit configuration of the radio-frequency module 1 according to the embodiment will be described below by referring to FIGS. 1 and 2. The case in which the transmit signals and the receive signals are TDD signals will be described.

(2.1) The First Power Amplifier

The first power amplifier 21 illustrated in FIG. 1 is an amplifier which amplifies the first transmit signals. The first power amplifier 21 is disposed between a first input terminal 52 and the first transmit filter 22 on a first transmit path P11 connecting a first antenna terminal 51 to the first input terminal 52. The first power amplifier 21 has an input terminal 211 and an output terminal 212. The input terminal 211 of the first power amplifier 21 is connected to an external circuit (for example, a signal processing circuit 82) through the first input terminal 52. The first input terminal 52 is a terminal at which radio-frequency signals (the first transmit signals) from the external circuit are received by the radio-frequency module 1. The output terminal 212 of the first power amplifier 21 is connected to the first transmit filter 22. The first power amplifier 21 is controlled, for example, by a power-amplifier controller (not illustrated). The first power amplifier 21 may be connected to the first transmit filter 22 directly or indirectly. The first power amplifier 21 may be connected to the first transmit filter 22, for example, through a first output matching circuit (not illustrated). The first output matching circuit is disposed between the first power amplifier 21 and the first transmit filter 22 on the first transmit path P11. The first output matching circuit matches the impedance between the first power amplifier 21 and the first transmit filter 22.

(2.2) The First Transmit Filter

The first transmit filter 22 illustrated in FIG. 1 is a transmit filter for the first communication band. The transmit filter for the first communication band passes the first transmit signals. More specifically, the first transmit filter 22 is disposed between the first power amplifier 21 and the switch module 3 on the first transmit path P11. The first transmit filter 22 passes the transmit signals in the transmit band of the first communication band, that is, the first transmit signals, among radio-frequency signals amplified by the first power amplifier 21.

(2.3) The First Receive Filter

The first receive filter 23 is a receive filter for the first communication band. The receive filter for the first communication band passes the first receive signals. More specifically, the first receive filter 23 is disposed between the switch module 3 (a first antenna switch 31) and the first low-noise amplifier 24 on the first receive path P21 connecting the first antenna terminal 51 to a first output terminal 53. The first receive filter 23 passes receive signals in the receive band of the first communication band, that is, the first receive signals, among radio-frequency signals which are received from the first antenna terminal 51.

(2.4) The First Low-Noise Amplifier

The first low-noise amplifier 24 illustrated in FIG. 1 is an amplifier which amplifies the first receive signals with low noise. The first low-noise amplifier 24 is disposed between the switch module 3 and the first output terminal 53 on the first receive path P21. The first low-noise amplifier 24 has an input terminal 241 and an output terminal 242. The input terminal 241 of the first low-noise amplifier 24 is connected to the switch module 3 (first antenna switch 31). The output terminal 242 of the first low-noise amplifier 24 is connected to an external circuit (for example, the signal processing circuit 82) through the first output terminal 53. The first output terminal 53 is a terminal from which radio-frequency signals (the first receive signals) from the first low-noise amplifier 24 are output to the external circuit.

(2.5) The Switch Module

As illustrated in FIG. 1, the switch module 3 includes the first antenna switch 31, a first low-pass filter 32, and a control circuit 33. The switch module 3 further includes a first antenna-side terminal 34 and multiple first filter-side terminals 35 (in the illustrated example, three terminals).

(2.6) The First Antenna Switch

The first antenna switch 31 illustrated in FIG. 1 is a switch which switches the path for connection to an antenna 81. The first antenna switch 31 has a common terminal 311 and multiple selection terminals 312 to 314 (in the illustrated example, three terminals). The common terminal 311 is connected to the first low-pass filter 32. The selection terminal 312 among the selection terminals 312 to 314 is connected to the duplexer 25. The common terminal 311 is connected to the first antenna terminal 51 through the first low-pass filter 32.

The first antenna switch 31 switches the connection state between the common terminal 311 and the selection terminals 312 to 314. The first antenna switch 31 is controlled, for example, by the signal processing circuit 82. The first antenna switch 31 electrically connects the common terminal 311 to any one of the selection terminals 312 to 314 in accordance with a control signal from an RF signal processing circuit 83 of the signal processing circuit 82.

(2.7) The First Low-Pass Filter

Figure 2:
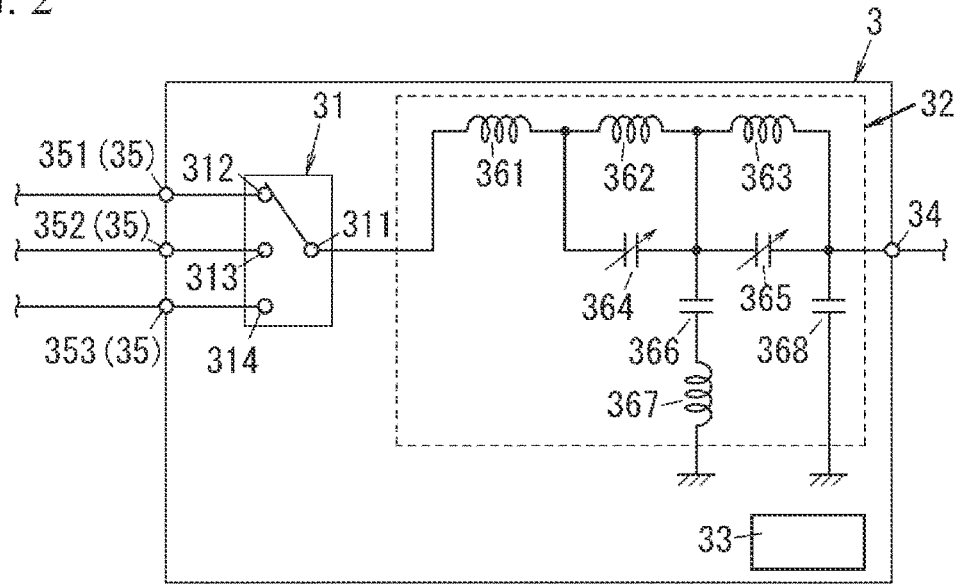
FIG. 2 is a diagram of the circuit configuration of a switch module in the radio-frequency module.

As illustrated in FIG. 2, the first low-pass filter 32 includes multiple inductors 361 to 363 (in the illustrated example, three inductors), multiple DTCs 364 and 365 (in the illustrated example, two DTCs), a capacitor 366, an inductor 367, and a capacitor 368.

The first low-pass filter 32 is disposed on the first transmit path P11 between the first antenna terminal 51 and the first power amplifier 21, and on the first receive path P21 between the first antenna terminal 51 and the first low-noise amplifier 24. The first low-pass filter 32 attenuates harmonic wave components of the first transmit signals.

The inductors 361 to 363 are connected in series between the first antenna switch 31 and the first antenna-side terminal 34. The DTCs 364 and 365 are connected in series between the inductor 361 and the first antenna-side terminal 34. The DTC 364 is connected to the inductor 362 in parallel; the DTC 365 is connected to the inductor 363 in parallel. The capacitor 366 and the inductor 367 are connected in series between the ground and the path between the DTC 364 and the DTC 365.

The capacitor 368 is connected between the ground and the path between the DTC 365 and the first antenna-side terminal 34.

When the first low-pass filter 32, having the circuit configuration described above, passes transmit signals, the capacitance of the DTCs 364 and 365 is decreased, and the reactance of the transmit path, through which the transmit signals go, is increased. This enables the first low-pass filter 32 to attenuate harmonic wave components of the transmit signals.

In contrast, for receive signals, the capacitance of the DTCs 364 and 365 is increased, and the reactance of the receive path, through which the receive signals go, is decreased. This enables the loss, which occurs when receive signals go through the path, to be reduced.

As described above, the first low-pass filter 32 has multiple paths. Each of the paths forms a part of either one or both of the first transmit path P11 and the first receive path P21. More specifically, the paths include a first path and a second path. The second path has a smaller reactance than the first path. Specifically, in the first low-pass filter 32, the path, which connects the first antenna switch 31 to the first antenna-side terminal 34 when the capacitance of the DTCs 364 and 365 is decreased, serves as the first path. In the first low-pass filter 32, the path, which connects the first antenna switch 31 to the first antenna-side terminal 34 when the capacitance of the DTCs 364 and 365 is increased, serves as the second path. In the first low-pass filter 32, transmit signals going through the first transmit path P11 go through the first path; receive signals going through the first receive path P21 go through the second path. Thus, while harmonic wave components of transmit signals are attenuated, an increase of the loss in receive signals may be suppressed.

The first path may be a path which goes through both the DTC 364 and the DTC 365; the second path may be a path which bypasses both the DTC 364 and the DTC 365. In this case, the second path is in a state in which the capacitance of the DTC 364 and the capacitance of the DTC 365 are equal to zero or close to zero. Alternatively, the first path may be a path which goes through both the DTC 364 and the DTC 365; the second path may be a path which bypasses either one or both of the DTC 364 and the DTC 365. In this case, the second path is in a state in which the capacitance of the DTC 364 is equal to zero or close to zero, or in a state in which the capacitance of the DTC 365 is equal to zero or close to zero. Alternatively, the first path may be a path which goes through either one or both of the DTC 364 and the DTC 365; the second path may be a path which bypasses both the DTC 364 and the DTC 365. In this case, the second path is in a state in which the capacitance of the DTC 364 and the capacitance of the DTC 365 are equal to zero or close to zero. Thus, while harmonic wave components of transmit signals are attenuated, an increase of the loss in receive signals may be suppressed.

(2.8) The Control Circuit

The control circuit 33 obtains a signal from the signal processing circuit 82, and controls switching of the first antenna switch 31 and the capacitance of the DTCs 364 and 365 of the first low-pass filter 32, on the basis of the obtained signal.

(2.9) The First Antenna-Side Terminal and the First Filter-Side Terminals

As illustrated in FIGS. 1 and 2, the first antenna-side terminal 34 is connected to the first low-pass filter 32 and the first antenna terminal 51.

The multiple first filter-side terminals 35 correspond one-to-one to the selection terminals 312 to 314 of the first antenna switch 31, and each of them is connected to the corresponding one of the selection terminals 312 to 314. More specifically, a first filter-side terminal 351 is connected to the selection terminal 312; a first filter-side terminal 352 is connected to the selection terminal 313; a first filter-side terminal 353 is connected to the selection terminal 314. The first filter-side terminal 351 is connected to the duplexer 25.

(3) The Structure of the Radio-Frequency Module

The structure of the radio-frequency module 1 according to the embodiment will be described below by referring to a drawing.

As illustrated in FIG. 3, the radio-frequency module 1 includes the mounting substrate 4, the external connection terminals 5, the first resin member 61, the second resin member 62, and the shield layer 63.

The radio-frequency module 1 is capable of being electrically connected to an external substrate (not illustrated). The external substrate corresponds, for example, to the mother board of the communication device 8 (such as a cellular phone or communication equipment). The state in which the radio-frequency module 1 is capable of being electrically connected to an external substrate refers to not only the case in which the radio-frequency module 1 is mounted directly on an external substrate, but also the case in which the radio-frequency module 1 is mounted indirectly on an external substrate. The case in which the radio-frequency module 1 is mounted indirectly on an external substrate refers to, for example, the case in which the radio-frequency module 1 is mounted on a different radio-frequency module mounted on an external substrate.

(3.1) The Mounting Substrate

As illustrated in FIG. 3, the mounting substrate 4 has a first principal surface 41 and a second principal surface 42. The first principal surface 41 is opposite the second principal surface 42 in the thickness direction D1 of the mounting substrate 4. The second principal surface 42 is opposite an external substrate (not illustrated) when the radio-frequency module 1 is disposed on the external substrate. The mounting substrate 4 is a double-sided mounting substrate having circuit components mounted on the first principal surface 41 and the second principal surface 42.

The mounting substrate 4 is a multilayer substrate which is a laminate of multiple dielectric layers. The mounting substrate 4 includes multiple conductor pattern units 43 and multiple through electrodes 44. The conductor pattern units 43 include a conductor pattern unit which is set to ground potential. The through electrodes 44 are used in electrical connection between devices, which are mounted on the first principal surface 41, and the conductor pattern units 43 of the mounting substrate 4. The through electrodes 44 are used in electrical connection between devices mounted on the first principal surface 41 and devices mounted on the second principal surface 42, and in electrical connection between the conductor pattern units 43 of the mounting substrate 4 and the external connection terminals 5.

The first power amplifier 21 and the duplexer 25 are disposed on the first principal surface 41 of the mounting substrate 4. The inductors 361 to 363 in the first low-pass filter 32 are disposed on the first principal surface 41 of the mounting substrate 4.

A switch IC including circuit devices other than the inductors 361 to 363 in the switch module 3 is disposed on the second principal surface 42 of the mounting substrate 4. The external connection terminals 5 are disposed on the second principal surface 42 of the mounting substrate 4.

(3.2) The First Power Amplifier

As illustrated in FIG. 3, the first power amplifier 21 is disposed on the first principal surface 41 of the mounting substrate 4. In the example in FIG. 3, the first power amplifier 21 is mounted on the first principal surface 41 of the mounting substrate 4. Alternatively, a part of the first power amplifier 21 may be mounted on the first principal surface 41 of the mounting substrate 4, and the remaining part of the first power amplifier 21 may be included in the mounting substrate 4. In short, the first power amplifier 21 is disposed closer to the first principal surface 41 than the second principal surface 42 in the mounting substrate 4, and has at least a part which is mounted on the first principal surface 41.

(3.3) The Duplexer

As described above, the duplexer 25 illustrated in FIG. 3 includes the first transmit filter 22 (see FIG. 1) and the first receive filter 23 (see FIG. 1).

The first transmit filter 22 is, for example, an acoustic wave filter including multiple serial arm resonators and multiple parallel arm resonators. The acoustic wave filter is, for example, a SAW (Surface Acoustic Wave) filter using surface acoustic waves. The first transmit filter 22 may include either one or both of an inductor and a capacitor which are connected in series to any of the serial arm resonators, or may include an inductor or a capacitor which is connected in series to any of the parallel arm resonators.

Similarly, the first receive filter 23 is, for example, an acoustic wave filter including multiple serial arm resonators and multiple parallel arm resonators. The acoustic wave filter is, for example, a SAW filter using surface acoustic waves. The first receive filter 23 may include either one or both of an inductor and a capacitor which are connected in series to any of the serial arm resonators, or may include an inductor or a capacitor which is connected in series to any of the parallel arm resonators.

As illustrated in FIG. 3, the duplexer 25 is disposed on the first principal surface 41 of the mounting substrate 4. In the example in FIG. 3, the duplexer 25 is mounted on the first principal surface 41 of the mounting substrate 4. Alternatively, a part of the duplexer 25 may be mounted on the first principal surface 41 of the mounting substrate 4, and the remaining part of the duplexer 25 may be included in the mounting substrate 4. In short, the duplexer 25 is disposed closer to the first principal surface 41 than the second principal surface 42 in the mounting substrate 4, and has at least a part which is mounted on the first principal surface 41.

(3.4) The Switch IC

As illustrated in FIG. 3, a switch IC 39, which is the switch module 3 other than the inductors 361 to 363, is disposed on the second principal surface 42 of the mounting substrate 4. The switch IC 39 is mounted, for example, on the second principal surface 42 of the mounting substrate 4. Alternatively, a part of the switch IC 39 may be mounted on the second principal surface 42 of the mounting substrate 4, and the remaining part of the switch IC 39 may be included in the mounting substrate 4. In short, the switch IC 39 is disposed closer to the second principal surface 42 than the first principal surface 41 in the mounting substrate 4, and has at least a part which is mounted on the second principal surface 42.

The switch IC 39 may be disposed on the first principal surface 41 of the mounting substrate 4. The switch IC 39 may be mounted, for example, on the first principal surface 41 of the mounting substrate 4. Alternatively, a part of the switch IC 39 may be mounted on the first principal surface 41 of the mounting substrate 4, and the remaining part of the switch IC 39 may be included in the mounting substrate 4. In short, the switch IC 39 is disposed closer to the first principal surface 41 than the second principal surface 42 in the mounting substrate 4, and has at least a part which is mounted on the first principal surface 41.

(3.5) The External Connection Terminals

As illustrated in FIG. 3, the external connection terminals 5 are terminals for electrically connecting the mounting substrate 4 to an external substrate (not illustrated). The external connection terminals 5 include the first antenna terminal 51, the first input terminal 52 and the first output terminal 53, and multiple ground terminals, which are illustrated in FIG. 1.

The external connection terminals 5 are disposed on the second principal surface 42 side of the mounting substrate 4. The external connection terminals 5 are columnar electrodes (for example, in a cylindrical column shape) disposed on the second principal surface 42 of the mounting substrate 4. The material of the external connection terminals 5 is, for example, metal (for example, copper, or copper alloy). Each of the external connection terminals 5 has a base-end portion and a leading-end portion. The base-end portion is joined to the second principal surface 42 of the mounting substrate 4 in the thickness direction D1 of the mounting substrate 4. The leading-end portion is opposite the base-end portion. The leading-end portion of each external connection terminal 5 may include, for example, a gold-plated layer.

The radio-frequency module 1 has the external connection terminals 5, for example, in view of ease of mounting the radio-frequency module 1 on a mother board and in view of provision of an increased number of ground terminals of the radio-frequency module 1.

(3.6) The First Resin Member and the Second Resin Member

As illustrated in FIG. 3, the first resin member 61 is disposed on the first principal surface 41 of the mounting substrate 4, and covers the circuit devices, which are disposed on the first principal surface 41, and the first principal surface 41 of the mounting substrate 4. The first resin member 61 has a function of ensuring reliability, such as mechanical strength and moisture resistance, of the circuit devices which are disposed on the first principal surface 41.

As illustrated in FIG. 3, the second resin member 62 is disposed on the second principal surface 42 of the mounting substrate 4, and covers the circuit devices, which are disposed on the second principal surface 42, and the second principal surface 42 of the mounting substrate 4. The second resin member 62 has a function of ensuring reliability, such as mechanical strength and moisture resistance, of the circuit devices disposed on the second principal surface 42.

(3.7) The Arrangement Relationship

As illustrated in FIG. 3, the first power amplifier 21 and the duplexer 25 are disposed on the first principal surface 41 side of the mounting substrate 4. The inductors 361 to 363 are disposed on the first principal surface 41 side of the mounting substrate 4. In contrast, the switch IC 39 is disposed on the second principal surface 42 side of the mounting substrate 4. That is, the DTCs 364 and 365 are disposed on the second principal surface 42 side of the mounting substrate 4. Thus, compared with the case in which the inductors 361 to 363 are disposed on the same principal surface side as that of the DTCs 364 and 365, the radio-frequency module 1 may be reduced in size.

In plan view in the thickness direction D1 of the mounting substrate 4, the inductors 361 to 363 overlap the switch IC 39. Thus, the path connecting the inductors 361 to 363 to the switch IC 39 may be made short, achieving a reduction of the loss caused by the length of the path.

In the embodiment, in plan view in the thickness direction D1 of the mounting substrate 4, the inductors 361 to 363 overlap the DTCs 364 and 365. Thus, the path connecting the inductors 361 to 363 to the DTCs 364 and 365 may be made short, achieving a reduction of the loss caused by the length of the path.

(4) The Detailed Structure of the Components of the Radio-Frequency Module

(4.1) The Mounting Substrate

The mounting substrate 4 illustrated in FIG. 3 is, for example, a printed wiring board or an LTCC (Low Temperature Co-fired Ceramics) substrate. In this example, the mounting substrate 4 is, for example, a multilayer substrate including the dielectric layers and the conductor pattern units 43. The dielectric layers and the conductor pattern units 43 are laminated in the thickness direction D1 of the mounting substrate 4. The conductor pattern units 43 are formed in their predetermined patterns. Each of the conductor pattern units 43 includes one or more conductor elements in a plane orthogonal to the thickness direction D1 of the mounting substrate 4. The material of the conductor pattern units 43 is, for example, copper.

The first principal surface 41 and the second principal surface 42 of the mounting substrate 4 are separated in the thickness direction D1 of the mounting substrate 4, and cross the thickness direction D1 of the mounting substrate 4. The first principal surface 41 of the mounting substrate 4 is, for example, orthogonal to the thickness direction D1 of the mounting substrate 4. The first principal surface 41, as a surface which is not orthogonal to the thickness direction D1, may include, for example, a side surface or the like of a conductor element. The second principal surface 42 of the mounting substrate 4 is, for example, orthogonal to the thickness direction D1 of the mounting substrate 4. The second principal surface 42, as a surface which is not orthogonal to the thickness direction D1, may include, for example, a side surface or the like of a conductor element. Fine unevenness, recesses, or protrusions may be formed on the first principal surface 41 and the second principal surface 42 of the mounting substrate 4.

(4.2) The Filters

The detailed structure of the first transmit filter 22 and the first receive filter 23 illustrated in FIG. 1 will be described. The first transmit filter 22 and the first receive filter 23 form the duplexer 25. In the description below, the first transmit filter 22 and the first receive filter 23 are not differentiated from each other, and are referred to as filters.

Each filter is a single-chip filter. In this example, each filter has, for example, multiple serial arm resonators and multiple parallel arm resonators which are acoustic-wave resonators. In this case, the filter includes, for example, a substrate, a piezoelectric-material layer, and multiple IDT electrodes (Interdigital Transducer). The substrate has a first surface and a second surface. The piezoelectric-material layer is disposed on the first surface of the substrate. The piezoelectric-material layer is disposed on a low-acoustic-velocity film. The IDT electrodes are disposed on the piezoelectric-material layer. In this example, the low-acoustic-velocity film is disposed on the substrate directly or indirectly. The piezoelectric-material layer is disposed on the low-acoustic-velocity film directly or indirectly. Through the low-acoustic-velocity film, bulk waves propagate at an acoustic velocity lower than that of acoustic waves propagating through the piezoelectric-material layer. Through the substrate, bulk waves propagate at an acoustic velocity higher than that of acoustic waves propagating through the piezoelectric-material layer. The material of the piezoelectric-material layer is, for example, lithium tantalate. The material of the low-acoustic-velocity film is, for example, silicon oxide. The substrate is, for example, a silicon substrate. The thickness of the piezoelectric-material layer is, for example, equal to or less than $3.5\lambda$ when the wavelength of an acoustic wave determined by the electrode-finger period of the IDT electrodes is $\lambda$. The thickness of the low-acoustic-velocity film is, for example, equal to or less than $2.0\lambda$.

The piezoelectric-material layer may have any configuration as long as the piezoelectric-material layer is formed, for example, of any of lithium tantalate, lithium niobate, zinc oxide, aluminum nitride, or PZT. The low-acoustic-velocity film may have any configuration as long as the low-acoustic-velocity film contains at least one material selected from the group of chemical compounds obtained by adding fluorine, carbon, or boron to silicon oxide, glass, silicon oxynitride, tantalum oxide, or silicon oxide. The substrate may have any configuration as long as the substrate contains at least one material selected from the group of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

Each filter further includes, for example, a spacer layer and a cover member. The spacer layer and the cover member are disposed on the first surface of the substrate. In plan view in the thickness direction of the substrate, the spacer layer surrounds the IDT electrodes. In plan view in the thickness direction of the substrate, the spacer layer has a frame shape (rectangular frame shape). The spacer layer has electrical insulation properties. The material of the spacer layer is, for example, synthetic resin, such as epoxy resin or polyimide. The cover member has a planar shape. In plan view in the thickness direction of the substrate, the cover member is rectangular. However, the configuration is not limited to this, and the cover member may be, for example, square. In plan view in the thickness direction of the substrate, in each filter, the outer size of the cover member, that of the spacer layer, and that of the cover member are substantially the same. The cover member is disposed on the spacer layer so as to be opposite the substrate in the thickness direction of the substrate. The cover member overlaps the IDT electrodes in the thickness direction of the substrate, and is separated from the IDT electrodes in the thickness direction of the substrate. The cover member has electrical insulation properties. The material of the cover member is, for example, synthetic resin, such as epoxy resin or polyimide. Each filter has a space surrounded by the substrate, the spacer layer, and the cover member. The space in each filter contains gas. The gas is, for example, air or inert gas (for example, nitrogen gas). Multiple terminals are exposed on the cover member. Each of the terminals is, for example, a bump. Each bump is, for example, a solder bump. Each bump is not limited to a solder bump, and may be, for example, a gold bump.

Each filter may include, for example, a close-contact layer interposed between the low-acoustic-velocity film and the piezoelectric-material layer. The close-contact layer is formed, for example, of resin (epoxy resin or polyimide resin). Each filter may include a dielectric film at either one of the following positions: between the low-acoustic-velocity film and the piezoelectric-material layer; on the top of the piezoelectric-material layer; and on the bottom of the low-acoustic-velocity film.

Each film may include, for example, a high-acoustic-velocity film interposed between the substrate and the low-acoustic-velocity film. In this example, the high-acoustic-velocity film is disposed on the substrate directly or indirectly. The low-acoustic-velocity film is disposed on the high-acoustic-velocity film directly or indirectly. The piezoelectric-material layer is disposed on the low-acoustic-velocity film directly or indirectly. The acoustic velocity of bulk waves propagating through the high-acoustic-velocity film is higher than that of acoustic waves propagating through the piezoelectric-material layer. The acoustic velocity of bulk waves propagating through the low-acoustic-velocity film is lower than that of acoustic waves propagating through the piezoelectric-material layer.

The high-acoustic-velocity film is formed of a material among the following materials: piezoelectric materials, such as diamond-like carbon, aluminum nitride, aluminum oxide, silicon carbide, silicon nitride, silicon, sapphire, lithium tantalate, lithium niobate, and crystal; various types of ceramic, such as alumina, zirconia, cordierite, mullite, steatite, and forsterite; magnesia; diamond; and materials whose main components are the materials described above; materials whose main components are mixtures of the materials described above.

The high-acoustic-velocity film, which has a function of confining acoustic waves in the piezoelectric-material layer and the low-acoustic-velocity film, is desirably as thicker as possible. The piezoelectric-material substrate may have, for example, a close-contact layer and a dielectric film as different films other than the high-acoustic-velocity film, the low-acoustic-velocity film, and the piezoelectric-material layer.

Each of the serial arm resonators and the parallel arm resonators is not limited to an acoustic-wave resonator described above, and may be, for example, a SAW resonator or a BAW (Bulk Acoustic Wave) resonator. In this example, the SAW resonator includes, for example, a piezoelectric-material substrate and IDT electrodes disposed on the piezoelectric-material substrate. When each of the serial arm resonators and the parallel arm resonators is formed by a SAW resonator, each filter has IDT electrodes corresponding one-to-one to the serial arm resonators, and IDT electrodes corresponding one-to-one to the parallel arm resonators, on a single piezoelectric-material substrate. The piezoelectric-material substrate is, for example, a lithium-tantalate substrate or a lithium-niobate substrate.

(4.3) The Switch IC

The switch IC 39 illustrated in FIGS. 1 and 3 is, for example, a single-chip IC including a substrate and a switch function unit. The substrate has a first surface and a second surface which are opposite each other. The substrate is, for example, a silicon substrate. The switch function unit includes a FET (Field Effect Transistor) formed on the first surface of the substrate. The switch function unit is a functional unit having a function of switching the connection state. The switch IC 39 is flip-chip packaged on the second principal surface 42 of the mounting substrate 4 so that the first surface of the substrate is positioned on the second principal surface 42 side of the mounting substrate 4. In plan view in the thickness direction D1 of the mounting substrate 4, the outer shape of the switch IC 39 is rectangular.

(4.4) The First Power Amplifier

The first power amplifier 21 illustrated in FIG. 1 is, for example, a single-chip IC including a substrate and an amplification function unit. The substrate has a first surface and a second surface which are opposite each other. The substrate is, for example, a gallium-arsenide substrate. The amplification function unit includes at least one transistor formed on the first surface of the substrate. The amplification function unit is a functional unit having a function of amplifying transmit signals in a predetermined frequency band. The transistor is, for example, an HBT (Heterojunction Bipolar Transistor). In the power amplifier, a power supply voltage from the power-amplifier controller is applied between the collector and the emitter of the HBT. In addition to the amplification function unit, the first power amplifier 21 may include, for example, a capacitor for cutting direct current. For example, the first power amplifier 21 is flip-chip packaged on the first principal surface 41 of the mounting substrate 4 so that the first surface of the substrate is positioned on the first principal surface 41 side of the mounting substrate 4. In plan view in the thickness direction D1 of the mounting substrate 4, the outer shape of the first power amplifier 21 is rectangular.

(4.5) The First Low-Noise Amplifier

The first low-noise amplifier 24 illustrated in FIG. 1 is, for example, a single IC chip including a substrate and an amplification function unit. The substrate has a first surface and a second surface which are opposite each other. The substrate is, for example, a silicon substrate. The amplification function unit is formed on the first surface of the surface. The amplification function unit is a functional unit having a function of amplifying receive signals in a predetermined frequency band. For example, the first low-noise amplifier 24 is flip-chip packaged on the second principal surface 42 of the mounting substrate 4 so that the first surface of the substrate is positioned on the second principal surface 42 side of the mounting substrate 4. In plan view in the thickness direction D1 of the mounting substrate 4, the outer shape of the first low-noise amplifier 24 is rectangular.

(5) The Communication Device

As illustrated in FIG. 1, the communication device 8 includes the radio-frequency module 1, a different radio-frequency module 7, the antenna 81, the signal processing circuit 82, and a diplexer 85. The diplexer 85 is formed by a low-pass filter 86 and a high-pass filter 87.

(5.1) The Different Radio-Frequency Module

As illustrated in FIG. 1, the radio-frequency module 7 includes a second power amplifier 71, a second transmit filter 72, a second receive filter 73, and a second low-noise amplifier 74. The radio-frequency module 7 further includes a second antenna switch 76 and a second low-pass filter 77. The second transmit filter 72 and the second receive filter 73 form a duplexer 75.

(5.1.1) The Second Power Amplifier

The second power amplifier 71 illustrated in FIG. 1 is an amplifier which amplifies the second transmit signals. The second power amplifier 71 is disposed between a second input terminal 702 and the second transmit filter 72 on a second transmit path P12 connecting a second antenna terminal 701 to the second input terminal 702. The second power amplifier 71 has an input terminal 711 and an output terminal 712. The input terminal 711 of the second power amplifier 71 is connected to an external circuit (for example, the signal processing circuit 82) through the second input terminal 702. The second input terminal 702 is a terminal through which radio-frequency signals (the second transmit signals) from the external circuit are received by the radio-frequency module 1. The output terminal 712 of the second power amplifier 71 is connected to the second transmit filter 72. The second power amplifier 71 is controlled, for example, by a power-amplifier controller (not illustrated). The second power amplifier 71 may have any configuration as long as the second power amplifier 71 is connected to the second transmit filter 72 directly or indirectly. The second power amplifier 71 may be connected to the second transmit filter 72, for example, through a second output matching circuit (not illustrated). The second output matching circuit is disposed between the second power amplifier 71 and the second transmit filter 72 on the second transmit path P12.

The second output matching circuit matches the impedance between the second power amplifier 71 and the second transmit filter 72.

(5.1.2) The Second Transmit Filter

The second transmit filter 72 is a transmit filter, for the second communication band, which passes the second transmit signals. More specifically, the second transmit filter 72 is disposed between the second power amplifier 71 and the second antenna switch 76 on the second transmit path P12. The second transmit filter 72 passes transmit signals in the transmit band of the second communication band, that is, the second transmit signals, among radio-frequency signals amplified by the second power amplifier 71.

(5.1.3) The Second Receive Filter

The second receive filter 73 is a receive filter, for the second communication band, which passes the second receive signals. More specifically, the second receive filter 73 is disposed between the second antenna switch 76 and the second low-noise amplifier 74 on a second receive path P22 connecting the second antenna terminal 701 to a second output terminal 703. The second receive filter 73 passes receive signals in the receive band of the second communication band, that is, the second receive signals, among radio-frequency signals received from the second antenna terminal 701.

(5.1.4) The Second Low-Noise Amplifier

The second low-noise amplifier 74 is an amplifier which amplifies the second receive signals with low noise. The second low-noise amplifier 74 is disposed between the second receive filter 73 and the second output terminal 703 on the second receive path P22. The second low-noise amplifier 74 has an input terminal 741 and an output terminal 742. The input terminal 741 of the second low-noise amplifier 74 is connected to the second receive filter 73. The output terminal 742 of the second low-noise amplifier 74 is connected to an external circuit (for example, the signal processing circuit 82) through the second output terminal 703. The second output terminal 703 is a terminal through which radio-frequency signals (the second receive signals) from the second low-noise amplifier 74 are output to the external circuit.

The second receive filter 73 and the second low-noise amplifier 74 are receive circuit devices disposed on a signal path for receive signals in the second communication band whose frequency band is higher than that of the first communication band.

(5.1.5) The Second Antenna Switch

The second antenna switch 76 illustrated in FIG. 1 is a switch for switching the path for connection to the antenna 81. The second antenna switch 76 has a common terminal 761 and multiple selection terminals 762 to 764 (in the illustrated example, three terminals). The common terminal 761 is connected to the second low-pass filter 77. The selection terminal 762 among the selection terminals 762 to 764 is connected to the duplexer 75. The common terminal 761 is connected to the second antenna terminal 701.

The second antenna switch 76 switches the connection state between the common terminal 761 and the selection terminals 762 to 764. The second antenna switch 76 is controlled, for example, by the signal processing circuit 82. The second antenna switch 76 electrically connects the common terminal 761 to any one of the selection terminals 762 to 764 in accordance with a control signal from the RF signal processing circuit 83 of the signal processing circuit 82.

(5.1.6) The Second Low-Pass Filter

The second low-pass filter 77 is disposed on the second transmit path P12 between the second antenna terminal 701 and the second power amplifier 71, and on the second receive path P22 between the second antenna terminal 701 and the second low-noise amplifier 74. The second low-pass filter 77 attenuates harmonic wave components of the second transmit signals.

(5.2) The Antenna

The antenna 81 is connected to the first antenna terminal 51 of the radio-frequency module 1. The antenna 81 has a transmission function of emitting, via radio waves, the first transmit signals, which are output from the radio-frequency module 1, and a reception function of receiving the first receive signals as radio waves from the outside to output the received signals to the radio-frequency module 1.

(5.3) The Signal Processing Circuit

The signal processing circuit 82 includes the RF signal processing circuit 83 and a baseband signal processing circuit 84. The signal processing circuit 82 processes the first transmit signals and the first receive signals, and the second transmit signals and the second receive signals.

The RF signal processing circuit 83, which is, for example, an RFIC (Radio Frequency Integrated Circuit), performs signal processing on radio-frequency signals.

The RF signal processing circuit 83 performs signal processing such as upconverting on radio-frequency signals which are output from the baseband signal processing circuit 84, and outputs radio-frequency signals, which have been subjected to signal processing, to the radio-frequency module 1. Specifically, the RF signal processing circuit 83 performs signal processing such as upconverting on the first transmit signals which are output from the baseband signal processing circuit 84, and outputs the first transmit signals, which have been subjected to signal processing, to the first transmit path P11 of the radio-frequency module 1. The RF signal processing circuit 83 performs signal processing such as upconverting on the second transmit signals which are output from the baseband signal processing circuit 84, and outputs the second transmit signals, which have been subjected to signal processing, to the second transmit path P12 of the radio-frequency module 1.

The RF signal processing circuit 83 performs signal processing such as down-converting on radio-frequency signals which are output from the radio-frequency module 1, and outputs radio-frequency signals, which have been subjected to signal processing, to the baseband signal processing circuit 84. Specifically, the RF signal processing circuit 83 performs signal processing on the first receive signals which are output from the first receive path P21 of the radio-frequency module 1, and outputs the first receive signals, which have been subjected to signal processing, to the baseband signal processing circuit 84. In addition, the RF signal processing circuit 83 performs signal processing on the second receive signals which are output from the second receive path P22 of the radio-frequency module 1, and outputs the second receive signals, which have been subjected to signal processing, to the baseband signal processing circuit 84.

The baseband signal processing circuit 84, which is, for example, a BBIC (Baseband Integrated Circuit), performs predetermined signal processing on transmit signals from the outside of the signal processing circuit 82. The receive signals, which have been processed by the baseband signal processing circuit 84, are used, for example, as image signals for image display or as audio signals for calling.

The RF signal processing circuit 83 also has a function as a control unit which controls the connection of the first antenna switch 31, which is included in the radio-frequency module 1, on the basis of the communication band (frequency band) in use. Specifically, the RF signal processing circuit 83 switches the connection of the first antenna switch 31 of the radio-frequency module 1 in accordance with a control signal (not illustrated). The control unit may be disposed outside the RF signal processing circuit 83. For example, the control unit may be disposed in the radio-frequency module 1 or the baseband signal processing circuit 84.

(6) Effects

In the radio-frequency module 1 according to the embodiment, the first low-pass filter 32 has, in addition to the first path, the second path having a smaller reactance than the first path. Thus, transmit signals or receive signals go through the second path, achieving a reduction of the loss in the first low-pass filter 32.

In the radio-frequency module 1 according to the embodiment, the first low-pass filter 32 has the first path which goes through the DTCs 364 and 365, and the second path which bypasses the DTCs 364 and 365. Thus, transmit signals or receive signals go through the second path, achieving a reduction of the loss in the first low-pass filter 32.

In the radio-frequency module 1 according to the embodiment, transmit signals go through the first path, and receive signals go through the second path having a smaller reactance than the first path. Thus, while harmonic wave components of transmit signals are attenuated, an increase of the loss in receive signals may be suppressed.

In the radio-frequency module 1 according to the embodiment, the first low-pass filter 32 is an LC filter having capacitors formed by digital tunable capacitors (DTCs 364 and 365). Thus, the cutoff frequency of the first low-pass filter 32 may be changed between the case in which signals go through the first path and the case in which signals go through the second path. The cutoff frequency of the first low-pass filter 32 may be changed in accordance with the communication band of signals going through the first path.

In the radio-frequency module 1 according to the embodiment, the inductors 361 to 363 are disposed on the first principal surface 41 side of the mounting substrate 4, and the digital tunable capacitors (DTCs 364 and 365) are disposed on the second principal surface 42 side of the mounting substrate 4. Thus, compared with the case in which the inductors 361 to 363 are disposed on the same principal surface side as the DTCs 364 and 365, the radio-frequency module 1 may be reduced in size.

In the radio-frequency module 1 according to the embodiment, the digital tunable capacitors (DTCs 364 and 365) are included in the switch IC 39. Thus, the area in which the DTCs 364 and 365 are disposed may be made small, achieving a further reduction of the radio-frequency module 1 in size.

In the radio-frequency module 1 according to the embodiment, in plan view in the thickness direction D1 of the mounting substrate 4, the inductors 361 to 363 overlap the switch IC 39. Thus, the path connecting the inductors 361 to 363 to the switch IC 39 may be made short, achieving a reduction of the loss caused by the length of the path.

In the radio-frequency module 1 according to the embodiment, in plan view in the thickness direction D1 of the mounting substrate 4, the inductors 361 to 363 overlap the digital tunable capacitors (DTCs 364 and 365). Thus, the path connecting the inductors 361 to 363 to the DTCs 364 and 365 may be made short, achieving a reduction of the loss caused by the length of the path.

(7) Modified Examples

Modified examples of the embodiment will be described below.

(7.1) A First Modified Example

Figure 4:
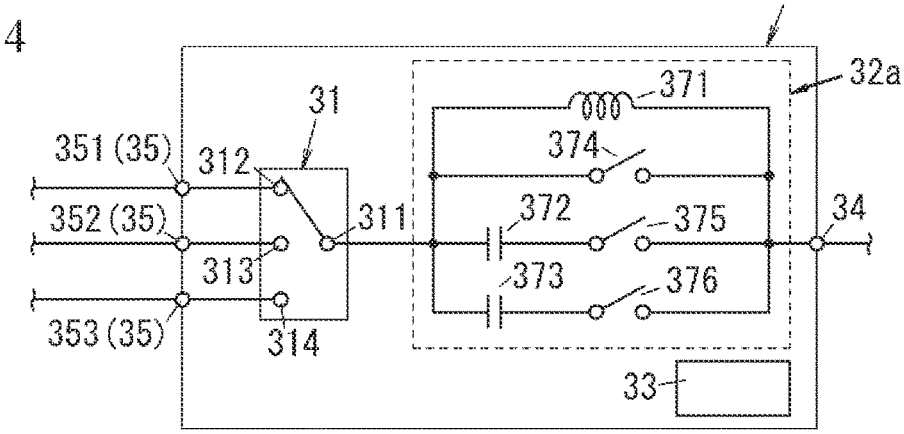
FIG. 4 is a diagram illustrating the circuit configuration of a switch module in a radio-frequency module according to a first modified example of an embodiment.

As a first modified example of the first embodiment, the radio-frequency module 1 may include a switch module 3a, as illustrated in FIG. 4, instead of the switch module 3 (see FIG. 2).

As illustrated in FIG. 4, the switch module 3a according to the first modified example includes the first antenna switch 31, a first low-pass filter 32a, and the control circuit 33. The switch module 3a further includes the first antenna-side terminal 34 and multiple first filter-side terminals 35 (in the illustrated example, three terminals).

As illustrated in FIG. 4, the first low-pass filter 32a includes an inductor 371, multiple capacitors 372 and 373 (in the illustrated example, two capacitors), and multiple switches 374 to 376 (in the illustrated example, three switches). The inductor 371 is connected between the first antenna switch 31 and the first antenna-side terminal 34. Each of the capacitors 372 and 373 is connected between the first antenna switch 31 and the first antenna-side terminal 34.

The switch 375 is connected in series to the capacitor 372 between the first antenna switch 31 and the first antenna-side terminal 34. The capacitor 372 and the switch 375, which form a series circuit, are connected to the inductor 371 in parallel.

The switch 376 is connected in series to the capacitor 373 between the first antenna switch 31 and the first antenna-side terminal 34. The capacitor 373 and the switch 376, which form a series circuit, are connected to the inductor 371 in parallel.

The switch 374 is connected, in parallel, to the series circuit of the capacitor 372 and the switch 375 and the series circuit of the capacitor 373 and the switch 376, between the first antenna switch 31 and the first antenna-side terminal 34.

For transmit signals, the first low-pass filter 32a, having the circuit configuration described above, switches the switch 374 to the off state, and switches either one or both of the switches 375 and 376 to the on state. Thus, the reactance of the transmit path through which the transmit signals go is made large. This enables the first low-pass filter 32a to attenuate harmonic wave components of the transmit signals.

In contrast, for receive signals, the switch 374 is switched to the on state, and the switches 375 and 376 are switched to the off state. Thus, the reactance of the receive path through which the receive signals go is made small. This enables reduction of the loss caused when the receive signals go through the path.

In the first low-pass filter 32a according to the first modified example, the path, which connects the first antenna switch 31 to the first antenna-side terminal 34 when the switch 374 is switched to the off state and either one or both of the switches 375 and 376 are switched to the on state, serves as the first path. In the first low-pass filter 32a, the path, which connects the first antenna switch 31 to the first antenna-side terminal 34 when the switch 374 is switched to the on state and the switches 375 and 376 are switched to the off state, serves as the second path.

According to the first modified example, the first path is a path which goes through either one or both of the capacitor 372 and the capacitor 373, and the second path is a path which bypasses the capacitor 372 and the capacitor 373.

(7.2) A Second Modified Example

Figure 5:
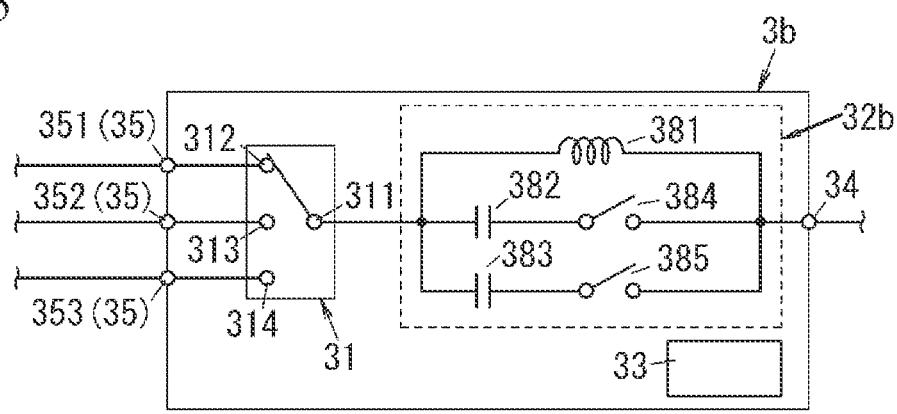
FIG. 5 is a diagram illustrating the circuit configuration of a switch module in a radio-frequency module according to a second modified example of an embodiment.

As a second modified example of the first embodiment, the radio-frequency module 1 may include a switch module 3b, as illustrated in FIG. 5, instead of the switch module 3 (see FIG. 2).

As illustrated in FIG. 5, the switch module 3b according to the second modified example includes the first antenna switch 31, a first low-pass filter 32b, and the control circuit 33. The switch module 3b further includes the first antenna-side terminal 34 and the first filter-side terminals 35 (in the illustrated example, three terminals).

As illustrated in FIG. 5, the first low-pass filter 32b includes an inductor 381, multiple capacitors 382 and 383 (in the illustrated example, two capacitors), and multiple switches 384 and 385 (in the illustrated example, two switches).

The inductor 381 is connected between the first antenna switch 31 and the first antenna-side terminal 34. Each of the capacitors 382 and 383 is connected between the first antenna switch 31 and the first antenna-side terminal 34.

The switch 384 is connected in series to the capacitor 382 between the first antenna switch 31 and the first antenna-side terminal 34. The capacitor 382 and the switch 384, which form a series circuit, are connected to the inductor 381 in parallel.

The switch 385 is connected in series to the capacitor 383 between the first antenna switch 31 and the first antenna-side terminal 34. The capacitor 383 and the switch 385, which form a series circuit, are connected to the inductor 381 in parallel.

For transmit signals, the first low-pass filter 32b, having the circuit configuration described above, switches both the switches 384 and 385 to the on state. Thus, the reactance of the transmit path through which the transmit signals go is made large. This enables the first low-pass filter 32b to attenuate harmonic wave components of the transmit signals.

In contrast, for receive signals, either one or both of the switches 384 and 385 are switched to the off state. Thus, the reactance of the receive path through which the receive signals go is made small. This enables reduction of the loss caused when the receive signals go through the path.

In the first low-pass filter 32b according to the second modified example, the path, which connects the first antenna switch 31 to the first antenna-side terminal 34 when both the switches 384 and 385 are switched to the on state, serves as the first path. In the first low-pass filter 32b, the path, which connects the first antenna switch 31 to the first antenna-side terminal 34 when either one or both of the switches 384 and 385 are switched to the off state, serves as the second path.

(7.3) A Third Modified Example

Figure 6:
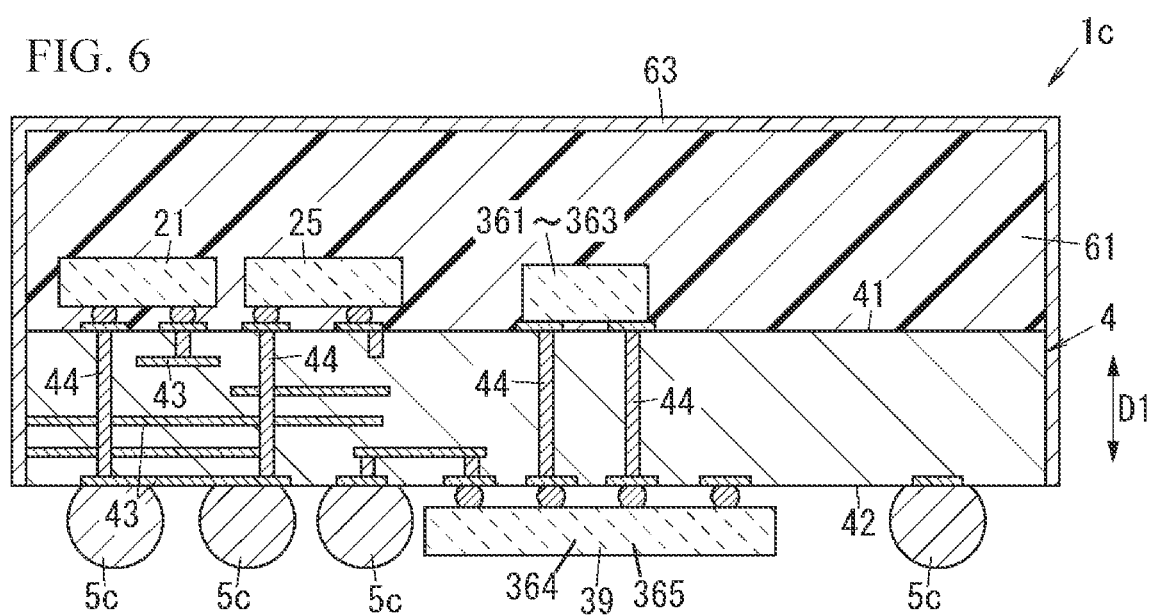
FIG. 6 is a cross-sectional view of a radio-frequency module according to a third modified example of an embodiment.

As a third modified example of the first embodiment, a radio-frequency module 1c may include multiple external connection terminals 5c, as illustrated in FIG. 6, instead of the external connection terminals 5 (see FIG. 3).

The external connection terminals 5c, which are not columnar electrodes, have a bump structure. The external connection terminals 5c are disposed on the second principal surface 42 of the mounting substrate 4. In the radio-frequency module 1c according to the third modified example, the second resin member 62 (see FIG. 3) is not illustrated.

(7.4) Other Modified Examples

As another modified example of the first embodiment, the first transmit filter 22 and the second transmit filter 72 are not limited to a surface-acoustic-wave filter, and may be a filter other than a surface-acoustic-wave filter. The first transmit filter 22 and the second transmit filter 72 may be, for example, any of the following filters: an acoustic wave filter using BAWs (Bulk Acoustic Waves); an LC resonant filter; a dielectric filter.

The radio-frequency modules according to the modified examples described above also exert effects substantially the same as those of the radio-frequency module 1 according to the embodiment.

The embodiment and modified examples described above are merely some of various embodiments and modified examples of the present disclosure. Various changes may be made on the embodiment and modified examples in accordance with the design or the like of the present disclosure may be attained.

In the specification, a "path which bypasses a capacitor" encompasses a path which does not go through a capacitor and which is branched at both the ends of the capacitor, and a path which goes through a capacitor whose capacitance is equal to zero or close to zero. The "capacitor" encompasses a DTC.

Aspects

The aspects described below are disclosed in the specification.

A radio-frequency module (1; 1c) according to a first aspect includes an antenna terminal (first antenna terminal 51), a power amplifier (first power amplifier 21), a low-noise amplifier (first low-noise amplifier 24), and a low-pass filter (first low-pass filter 32; 32a; 32b). The low-pass filter is disposed on a transmit path (first transmit path P11) and on a receive path (first receive path P21). The transmit path is a path between the antenna terminal and the power amplifier. The receive path is a path between the antenna terminal and the low-noise amplifier. The low-pass filter has multiple paths. Each of the paths forms a part of at least one of the transmit path or the receive path. The paths include a first path and a second path. The second path has a smaller reactance than the first path.

In the radio-frequency module (1; 1c) according to the first aspect, either one or both of transmit signals, which go through the transmit path (first transmit path P11), and receive signals, which go through the receive path (first receive path P21), go through the second path, achieving a reduction of the loss in the low-pass filter (first low-pass filter 32; 32a; 32b).

A radio-frequency module (1; 1c) according to a second aspect includes an antenna terminal (first antenna terminal 51), a power amplifier (first power amplifier 21), a low-noise amplifier (first low-noise amplifier 24), and a low-pass filter (first low-pass filter 32; 32a). The low-pass filter is disposed on a transmit path (first transmit path P11) and on a receive path (first receive path P21). The transmit path is a path between the antenna terminal and the power amplifier. The receive path is a path between the antenna terminal and the low-noise amplifier. The low-pass filter has multiple paths. Each of the paths forms a part of at least one of the transmit path or the receive path. The low-pass filter includes an inductor (361; 362; 363; 371) and a capacitor (DTC 364; 365, capacitor 372; 373). The paths include a first path and a second path. The first path goes through the capacitor. The second path bypasses the capacitor.

In the radio-frequency module (1; 1c) according to the second aspect, either one or both of transmit signals, which go through the transmit path (first transmit path P11), and receive signals, which go through the receive path (first receive path P21), go through the second path, achieving a reduction of the loss in the low-pass filter (first low-pass filter 32; 32a).

According to a third aspect, in the radio-frequency module (1; 1c) according to the first or second aspect, in the low-pass filter (first low-pass filter 32; 32a; 32b), a transmit signal that goes through the transmit path (first transmit path P11) goes through the first path. A receive signal that goes through the receive path (first receive path P21) goes through the second path.

While attenuating harmonic wave components of transmit signals, the radio-frequency module (1; 1c) according to the third aspect may suppress an increase of the loss in receive signals.

According to a fourth aspect, the radio-frequency module (1; 1c) according to any one of the first to third aspects, the low-pass filter (first low-pass filter 32; 32a; 32b) includes an inductor (361; 362; 363) and a capacitor. The capacitor is a digital tunable capacitor (DTC 364; 365).

In the radio-frequency module (1; 1c) according to the fourth aspect, the cutoff frequency of the low-pass filter (first low-pass filter 32; 32a; 32b) may be changed between the case in which signals go through the first path and the case in which signals go through the second path. In addition, the cutoff frequency of the low-pass filter may be changed in accordance with the communication band of signals going through the first path.

According to a fifth aspect, the radio-frequency module (1; 1c) according to the fourth aspect further includes a mounting substrate (4) and an external connection terminal (5). The mounting substrate (4) has a first principal surface (41) and a second principal surface (42) which are opposite each other. The external connection terminal (5) is disposed on the second principal surface (42) side of the mounting substrate (4). The inductor (361; 362; 363) is disposed on the first principal surface (41) side. The digital tunable capacitor (DTC 364; 365) is disposed on the second principal surface (42) side.

In the radio-frequency module (1; 1c) according to the fifth aspect, compared with the case in which the inductor (361; 362; 363) is disposed on the same principal surface side as the digital tunable capacitor (DTC 364; 365), the radio-frequency module (1; 1c) may be reduced in size.

According to a sixth aspect, the radio-frequency module (1; 1c) according to the fifth aspect further includes an antenna switch (first antenna switch 31). The antenna switch is a switch for switching a path for connection to an antenna (81). The digital tunable capacitor (DTC 364; 365) and the antenna switch are included in a switch IC (39).

The radio-frequency module (1; 1c) according to the sixth aspect enables the area, in which the digital tunable capacitor (DTC 364; 365) is disposed, to be made small, achieving a further reduction of the radio-frequency module (1; 1c) in size.

According a seventh aspect, in the radio-frequency module (1; 1c) according to the sixth aspect, the inductor (361; 362; 363) overlaps the switch IC (39) in plan view in a thickness direction (D1) of the mounting substrate (4).

The radio-frequency module (1; 1c) according to the seventh aspect enables the path, which connects the inductor (361; 362; 363) to the switch IC (39), to be made short, achieving a reduction of the loss caused by the length of the path.

According to an eighth aspect, in the radio-frequency module (1; 1c) according to the seventh aspect, the inductor (361; 362; 363) overlaps the digital tunable capacitor (DTC 364; 365) in plan view in the thickness direction (D1) of the mounting substrate (4).

The radio-frequency module (1; 1c) according to the eighth aspect enables the path, which connects the inductor (361; 362; 363) to the digital tunable capacitor (DTC 364; 365), to be made short, achieving a reduction of the loss caused by the length of the path.

According to a ninth aspect, in the radio-frequency module (1; 1c) according to any one of the first to eighth aspects, a transmit signal which goes through the transmit path (first transmit path P11) and a receive signal which goes through the receive path (first receive path P21) are TDD signals.

According to a tenth aspect, in the radio-frequency module (1; 1c) according to any one of the first to eighth aspects, a transmit signal which goes through the transmit path (first transmit path P11) and a receive signal which goes through the receive path (first receive path P21) are FDD signals.

A communication device (8) according to an eleventh aspect includes the radio-frequency module (1; 1c) according to any one of the first to tenth aspects, and a signal processing circuit (82). The signal processing circuit (82) processes a transmit signal which goes through the transmit path (first transmit path P11) and a receive signal which goes through the receive path (first receive path P21).

In the communication device (8) according to the eleventh aspect, transmit signals or receive signals go through the second path, achieving a reduction of loss in the low-pass filter (first low-pass filter 32; 32a; 32b).

REFERENCE SIGNS LIST 1, 1c radio-frequency module
21 first power amplifier (power amplifier)
211 input terminal
212 output terminal
22 first transmit filter
23 first receive filter
24 first low-noise amplifier (low-noise amplifier)
241 input terminal
242 output terminal
25 duplexer
3, 3a, 3b switch module
31 first antenna switch (antenna switch)
311 common terminal
312 to 314 selection terminal
32, 32a, 32b first low-pass filter (low-pass filter)
33 control circuit
34 first antenna-side terminal
35, 351 to 353 first filter-side terminal
361 to 363 inductor
364, 365 DTC (capacitor)
366, 368 capacitor
367 inductor
371 inductor
372, 373 capacitor
374 to 376 switch
381 inductor
382, 383 capacitor
384, 385 switch
39 switch IC
4 mounting substrate
41 first principal surface
42 second principal surface
43 conductor pattern unit
44 through electrode
5, 5c external connection terminal
51 first antenna terminal (antenna terminal)
52 first input terminal
53 first output terminal
61 first resin member
62 second resin member
63 shield layer
7 radio-frequency module
701 second antenna terminal
702 second input terminal
703 second output terminal
71 second power amplifier
711 input terminal
712 output terminal
72 second transmit filter
73 second receive filter
74 second low-noise amplifier
741 input terminal
742 output terminal
75 duplexer
76 second antenna switch
761 common terminal
762 to 764 selection terminal
77 second low-pass filter
8 communication device
81 antenna
82 signal processing circuit
83 RF signal processing circuit
84 baseband signal processing circuit
85 diplexer
86 low-pass filter
87 high-pass filter
P11 first transmit path
P12 second transmit path
P21 first receive path
P22 second receive path
D1 thickness direction

The invention claimed is:

1. A radio-frequency module comprising:
an antenna terminal;
a power amplifier;
a low-noise amplifier; and
a low-pass filter that is in a transmit path between the antenna terminal and the power amplifier, and in a receive path between the antenna terminal and the low-noise amplifier, wherein the low-pass filter has a plurality of paths therethrough, each of the plurality of paths forming a part of the transmit path and/or the receive path, and
wherein the plurality of paths comprise:
a first path, and
a second path having a smaller reactance than the first path.

2. The radio-frequency module according to claim 1, wherein, in the low-pass filter:
a transmit signal that passes through the transmit path passes through the first path, and
a receive signal that passes through the receive path passes through the second path.

3. The radio-frequency module according to claim 1, wherein the low-pass filter comprises:
an inductor, and
a capacitor, and
wherein the capacitor is a digital tunable capacitor.

4. The radio-frequency module according to claim 3, further comprising:
a mounting substrate that has a first principal surface and a second principal surface that are opposite each other; and
an external connection terminal that is on a second principal surface side of the mounting substrate,
wherein the inductor is on a first principal surface side of the mounting substrate, and
wherein the digital tunable capacitor is on the second principal surface side of the mounting substrate.

5. The radio-frequency module according to claim 4, further comprising:
an antenna switch configured to switch a path for connection to an antenna,
wherein the digital tunable capacitor and the antenna switch are in a switch integrated circuit (IC).

6. The radio-frequency module according to claim 5, wherein the inductor overlaps the switch IC in plan view in a thickness direction of the mounting substrate.

7. The radio-frequency module according to claim 6, wherein the inductor overlaps the digital tunable capacitor in plan view in the thickness direction of the mounting substrate.

8. The radio-frequency module according to claim 1, wherein a transmit signal that passes through the transmit path and a receive signal that passes through the receive path are time division duplex (TDD) signals.

9. The radio-frequency module according to claim 1, wherein a transmit signal that passes through the transmit path and a receive signal that passes through the receive path are frequency division duplex (FDD) signals.

10. A communication device comprising:
the radio-frequency module according to claim 1; and
a signal processing circuit configured to process a transmit signal that passes through the transmit path and a receive signal that passes through the receive path.

11. A radio-frequency module comprising:
an antenna terminal;
a power amplifier;
a low-noise amplifier; and
a low-pass filter that is in a transmit path between the antenna terminal and the power amplifier, and in a receive path between the antenna terminal and the low-noise amplifier,
wherein the low-pass filter has a plurality of paths therethrough, each of the plurality of paths forming a part of the transmit path and/or the receive path,
wherein the low-pass filter comprises:
an inductor, and
a capacitor, and
wherein the plurality of paths comprise:
a first path that passes through the capacitor, and
a second path that bypasses the capacitor.

12. The radio-frequency module according to claim 11, wherein, in the low-pass filter:
a transmit signal that passes through the transmit path passes through the first path, and
a receive signal that passes through the receive path passes through the second path.

13. The radio-frequency module according to claim 11, wherein the capacitor is a digital tunable capacitor.

14. The radio-frequency module according to claim 13, further comprising:
a mounting substrate that has a first principal surface and a second principal surface that are opposite each other; and
an external connection terminal that is on a second principal surface side of the mounting substrate,
wherein the inductor is on a first principal surface side of the mounting substrate, and
wherein the digital tunable capacitor is on the second principal surface side of the mounting substrate.

15. The radio-frequency module according to claim 14, further comprising:
an antenna switch configured to switch a path for connection to an antenna,
wherein the digital tunable capacitor and the antenna switch are in a switch integrated circuit (IC).

16. The radio-frequency module according to claim 15, wherein the inductor overlaps the switch IC in plan view in a thickness direction of the mounting substrate.

17. The radio-frequency module according to claim 16, wherein the inductor overlaps the digital tunable capacitor in plan view in the thickness direction of the mounting substrate.

18. The radio-frequency module according to claim 11, wherein a transmit signal that passes through the transmit path and a receive signal that passes through the receive path are time division duplex (TDD) signals.

19. The radio-frequency module according to claim 11, wherein a transmit signal that passes through the transmit path and a receive signal that passes through the receive path are frequency division duplex (FDD) signals.

20. A communication device comprising:
radio-frequency module according to claim 11; and
a signal processing circuit configured to process a transmit signal that passes through the transmit path and a receive signal that passes through the receive path.

* * * * *

UNITED STATES PATENT AND TRADEMARK OFFICE
CERTIFICATE OF CORRECTION

PATENT NO. : 12,431,933 B2
APPLICATION NO. : 17/934692
DATED : September 30, 2025
INVENTOR(S) : Reiji Nakajima Page 1 of 1

It is certified that error appears in the above-identified patent and that said Letters Patent is hereby corrected as shown below:

In the Claims

Column 24, Line 55, "radio-frequency module" should be --the radio-frequency module--

Signed and Sealed this
Ninth Day of December, 2025

John A. Squires
*Director of the United States Patent and Trademark Office*